(12) United States Patent
Arai et al.

(10) Patent No.: US 10,074,760 B2
(45) Date of Patent: Sep. 11, 2018

(54) SOLAR CELL BACK SHEET AND SOLAR CELL MODULE

(71) Applicant: Toray Industries, Inc., Tokyo (JP)

(72) Inventors: Takashi Arai, Otsu (JP); Michiko Minomo, Otsu (JP); Takashi Sato, Tokyo (JP); Takao Amioka, Otsu (JP)

(73) Assignee: Toray Industries, Inc. (JP)

( * ) Notice: Subject to any disclaimer, the term of this patent is extended or adjusted under 35 U.S.C. 154(b) by 0 days.

(21) Appl. No.: 15/127,542

(22) PCT Filed: Mar. 19, 2015

(86) PCT No.: PCT/JP2015/058232
§ 371 (c)(1),
(2) Date: Sep. 20, 2016

(87) PCT Pub. No.: WO2015/146780
PCT Pub. Date: Oct. 1, 2015

(65) Prior Publication Data
US 2017/0133530 A1    May 11, 2017

(30) Foreign Application Priority Data

Mar. 24, 2014  (JP) ................................. 2014-059518

(51) Int. Cl.
*H01L 31/049* (2014.01)
*H01L 31/18* (2006.01)
(Continued)

(52) U.S. Cl.
CPC .......... *H01L 31/049* (2014.12); *B05D 3/0254* (2013.01); *B32B 27/08* (2013.01);
(Continued)

(58) Field of Classification Search
CPC .................................................. H01L 31/049
(Continued)

(56) References Cited

U.S. PATENT DOCUMENTS

| 2006/0247376 A1* | 11/2006 | Hasegawa | C08G 18/62 525/123 |
| 2010/0175737 A1* | 7/2010 | Guo | C08J 5/18 136/244 |

(Continued)

FOREIGN PATENT DOCUMENTS

| EP | 2 624 308 A1 | 8/2013 |
| JP | 2002-26354 A | 1/2002 |

(Continued)

OTHER PUBLICATIONS

The First Office Action dated Mar. 25, 2017, of corresponding Chinese Application No. 201580015472.7, along with an English translation.

(Continued)

*Primary Examiner* — Ramsey E Zacharia
(74) *Attorney, Agent, or Firm* — DLA Piper LLP (US)

(57) ABSTRACT

A back sheet for a photovoltaic module includes a single substrate film and a layer C, the layer C contains an acrylic resin as a major component, the substrate film including a layer A and a layer B, wherein the layer A contains a polyester resin as a major component, contains a white pigment in an amount of 5.0% by mass to 25% by mass, has a thickness of 5 μm or more, and is disposed on another surface of the back sheet, and the layer B contains a polyester resin as a major component, contains a white pigment in an amount of 1.0% by mass to less than 5.0% by mass based on the total amount of the layer B, and has a thickness accounting for 70% or more of the total thickness of the back sheet. The layer C may be made of a composition of an acrylic resin having a reactive functional group, a protected isocyanate compound, and an unprotected isocyanate compound.

6 Claims, 4 Drawing Sheets

(51) Int. Cl.
  *B32B 27/26* (2006.01)
  *B32B 27/30* (2006.01)
  *B32B 27/40* (2006.01)
  *B32B 27/20* (2006.01)
  *B05D 3/02* (2006.01)
  *B32B 27/36* (2006.01)
  *B32B 27/08* (2006.01)

(52) U.S. Cl.
  CPC .............. *B32B 27/20* (2013.01); *B32B 27/26* (2013.01); *B32B 27/308* (2013.01); *B32B 27/36* (2013.01); *H01L 31/18* (2013.01); *B32B 2255/10* (2013.01); *B32B 2255/26* (2013.01); *B32B 2264/102* (2013.01); *B32B 2307/4026* (2013.01); *B32B 2307/712* (2013.01); *B32B 2457/12* (2013.01); *Y02E 10/50* (2013.01)

(58) Field of Classification Search
  USPC .................................................. 525/123, 124
  See application file for complete search history.

(56) References Cited

U.S. PATENT DOCUMENTS

| | | |
|---|---|---|
| 2013/0065063 A1 | 3/2013 | Masuda et al. |
| 2014/0069495 A1* | 3/2014 | Takanashi ............. B32B 27/308 |
| | | 136/256 |

FOREIGN PATENT DOCUMENTS

| | | |
|---|---|---|
| JP | 2003-155403 A | 5/2003 |
| JP | 2006-332091 A | 12/2006 |
| JP | 2007-70430 A | 3/2007 |
| JP | 2011-18872 A | 1/2011 |
| JP | 2011-249756 A | 12/2011 |
| JP | 2013-251427 A | 12/2013 |
| WO | 2012/043000 A1 | 4/2012 |

OTHER PUBLICATIONS

The Second Office Action dated Nov. 9, 2017, of corresponding Chinese Application No. 201580015472.7, along with an English translation.

* cited by examiner

SOLAR CELL BACK SHEET AND SOLAR CELL MODULE

TECHNICAL FIELD

This disclosure relates to a back sheet for use as a member for a photovoltaic module, which back sheet has high adhesive strength to an encapsulant and environmental resistance and can withstand use in a harsh outdoor environment over a long period of time, and to a photovoltaic module including the back sheet.

BACKGROUND

In recent years, there has been a fear that fossil fuels including petroleum and coal would run out, and it is urgently required to develop alternative energy sources to these fossil fuels. Accordingly, various methods for nuclear power generation, water power generation, wind power generation, and photovoltaic power generation have been studied, and some have been in actual use.

Photovoltaic power generation, which can convert the energy of sunlight directly into electric energy, has been put to practical use as a new, pollution-free energy source that will be available virtually permanently. Its cost performance in practical use has improved rapidly, making it a promising clean energy source.

Solar batteries used for photovoltaic power generation that directly convert the energy of sunlight into electric energy and serve as the core portion of photovoltaic systems are made of semiconductors such as silicon. They have structures in which photovoltaic elements are arranged in series or in parallel and packaged in various ways into a unit to protect the elements over a long time of 20 years or so. Such a packaged unit, which is called a photovoltaic module, is typically composed of a glass layer to cover the face that receives sunlight, an encapsulant of resin to fill gaps, and a resin sheet called a back sheet for photovoltaic module to protect the backside surface. For the encapsulant, ethylene-vinyl acetate copolymer resins (hereinafter referred to as EVA resins) are often used because they have high transparency and moisture resistance. The back sheet for photovoltaic module requires properties such as mechanical strength, weather resistance, heat resistance, water resistance, chemical resistance, light reflectivity, water vapor barrier properties, adhesion to the encapsulant, design properties, and adhesion of its outermost layer to silicone resin adhesives for attaching a terminal box.

One example of the back sheet for photovoltaic module traditionally used is a back sheet for photovoltaic module including a polyester film and white polyvinyl fluoride films having high weather resistance (e.g., "TEDLAR" (registered trademark) available from Du Pont Kabushiki Kaisha) bonded to both surfaces of the polyester film with an adhesive such as a polyurethane resin. The back sheet for photovoltaic module having such a lamination configuration that a polyester film is sandwiched between the above films has been widely used in the applications of interest. There is also disclosed a configuration in which a polyester film having high weather resistance and gas barrier properties is bonded with an adhesive (JP 2002-026354 A). In general, polyester films, including polyethylene terephthalate resins, have not so high adhesion to EVA resins, which are most commonly used as encapsulant resins. Thus, to improve the adhesive strength, a configuration is proposed in which an adhesion-improving coating layer made of an acrylic resin or an epoxy resin is provided to improve the adhesion to an encapsulant layer made of an EVA resin (JP 2006-332091 A).

General-purpose polyester resin films, when hydrolyzed, have reduced molecular weights and are embrittled, resulting in reduced mechanical properties. Thus, an improvement thereof, i.e., the improvement in moist-heat resistance is demanded. To meet that demand, various studies have been made to prevent the hydrolysis of polyester resins. With regard to biaxially-oriented polyester films, for example, studies have been made to increase the molecular weight of a resin of a film and control the degree of planar orientation to thereby improve the moist-heat resistance (JP 2007-70430 A).

Furthermore, for application to back sheets for photovoltaic module, it is also desired to impart properties other than moist-heat resistance, in particular, UV resistance and light reflectivity to provide more functions. To achieve this, studies have been made to use polyesters made of more than one component or add other components to provide more functions (e.g., JP 2003-155403 A).

To further improve adhesion of a back sheet for photovoltaic module to an encapsulant made of, for example, an EVA resin and the durability of the adhesion, studies have been made to form an adhesive layer made of a fluoro copolymer, an acrylic copolymer, or a polyurethane polymer, which has high durability, and an isocyanate compound on a polyester film (JP 2011-18872 A).

Although providing good initial adhesive strength to the encapsulant, the adhesive layer made of an acrylic resin or an epoxy resin, when exposed to environmental stresses such as heat, humidity, and UV radiation, may undergo a reduction in interfacial adhesion between the adhesion-improving coating layer and the encapsulant layer, which can cause delamination in extreme cases. Furthermore, exposure to light passing through silicon cells may cause photodegradation of the back sheet for photovoltaic module, leading to defects such as yellowing.

Among the properties that the back sheet for photovoltaic module requires, with regard to weather resistance, which is important for stable protection maintained for a long period of time, adding other components (e.g., UV absorbers and inorganic particles) to provide a polyester film, in particular, a polyester film containing ethylene terephthalate units as a major component with more functions disadvantageously promotes degradation due to, for example, hydrolysis during melt mixing in the manufacturing process or during use. Furthermore, although functions of the components added are provided, moist-heat resistance disadvantageously decreases.

Although excellent in adhesive strength to an encapsulant layer and weather resistance of the polyvinyl fluoride films bonded to both surfaces, the above-described back sheet for photovoltaic module having a configuration in which polyvinyl fluoride films are bonded to a polyester film with an adhesive is disadvantageous in that it is expensive and may fail to maintain sufficient protection. For example, delamination may occur due to moist-heat degradation of the adhesive layer, or the polyester film sandwiched between the polyvinyl fluoride films, depending on its properties, may undergo hydrolysis when exposed to heat and humidity for a long period of time to cause a decrease in mechanical strength.

In view of the above disadvantages, it could be helpful to provide a back sheet for photovoltaic modules having adhesive strength to the encapsulant sufficient for the back sheet for photovoltaic module and is excellent in productivity, weather resistance to photoirradiation from the light-receiving side and the rearmost side of a photovoltaic module, and heat-curling properties.

It could also be helpful to provide a back sheet for photovoltaic module having increased adhesive strength to the encapsulant and increased durability of the adhesive strength.

SUMMARY

We thus provide:

A back sheet for photovoltaic module, the back sheet comprising:

a single substrate film; and a layer C, the layer C comprising an acrylic resin as a major component and being disposed on one surface of the back sheet, the substrate film including a layer A and a layer B, wherein the layer A comprises a polyester resin as a major component, comprises a white pigment in an amount of 5.0% by mass to 25% by mass, has a thickness of 5 μm or more, and is disposed on another surface of the back sheet; and the layer B comprises a polyester resin as a major component, contains a white pigment in an amount of 1.0% by mass to less than 5.0% by mass based on the total amount of the layer B, and has a thickness accounting for 70% or more of the total thickness of the back sheet.

The above-described back sheet for photovoltaic module, wherein the layer C is made of a layer-C-forming material composition (I) containing an acrylic resin having hydroxyl groups, an isocyanate compound, and a pigment.

A back sheet for photovoltaic module, the back sheet including:

a substrate film; and a layer C, the layer C being disposed on one surface of the back sheet, the layer C being made of a layer-C-forming material composition (II), wherein the layer-C-forming material composition (II) includes an acrylic resin having a functional group reactive with an isocyanate group and two or more isocyanate compounds, the isocyanate compounds including a blocked isocyanate compound having isocyanate groups protected by blocking groups and an isocyanate compound having isocyanate groups not protected by blocking groups.

A photovoltaic module including, in sequence, a light-receiving-side protective substrate, a light-receiving-side encapsulant, cells, a backside encapsulant, and the back sheet for photovoltaic module, wherein the layer C of the back sheet for photovoltaic module faces the backside encapsulant.

A method of producing a photovoltaic module, the method including disposing, in sequence, a light-receiving-side protective substrate, a light-receiving-side encapsulant, cells, a backside encapsulant, and the back sheet for photovoltaic module such that the layer C of the back sheet for photovoltaic module faces the backside encapsulant, thereby forming a layered product, and heating the layered product.

We thus provide a back sheet for photovoltaic module excellent in adhesive strength to the encapsulant, light reflection properties, productivity, and weather resistance and can withstand use in a harsh outdoor environment over a long period of time. Through the use of the back sheet for photovoltaic module, a photovoltaic module can be obtained that is excellent in adhesive strength between the encapsulant and the back sheet for photovoltaic module, weather resistance, and photovoltaic-element-protective performance over a long period of time.

We also provide a back sheet for photovoltaic module excellent in adhesive strength to encapsulant and can withstand use in a harsh outdoor environment over a long period of time. Through the use of the back sheet for photovoltaic module, a photovoltaic module can be obtained that is excellent in interfacial adhesion between the encapsulant and the back sheet for photovoltaic module.

DESCRIPTION OF SYMBOLS

Figure 1:
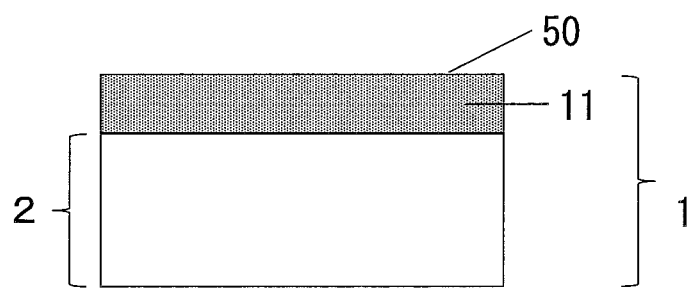
FIG. 1 is a schematic cross-sectional view of an example of the back sheet for photovoltaic module.

1: Back sheet for photovoltaic module
2: Substrate film
3: Photovoltaic cell
4: Adhesive
5: Light-receiving-side protective substrate
6: Encapsulant
7: Terminal box
8: Adhesive
9: Wire
10: Frame
11: Layer C
20: Layer B
30: Layer A
40: Layer D
50: Encapsulant-receiving side

DETAILED DESCRIPTION

Back Sheet for Photovoltaic Module

A detailed description will now be given of the back sheet for photovoltaic module according to the first and second constructions. The back sheet for photovoltaic module has a substrate film and a layer C.

Figure 4:
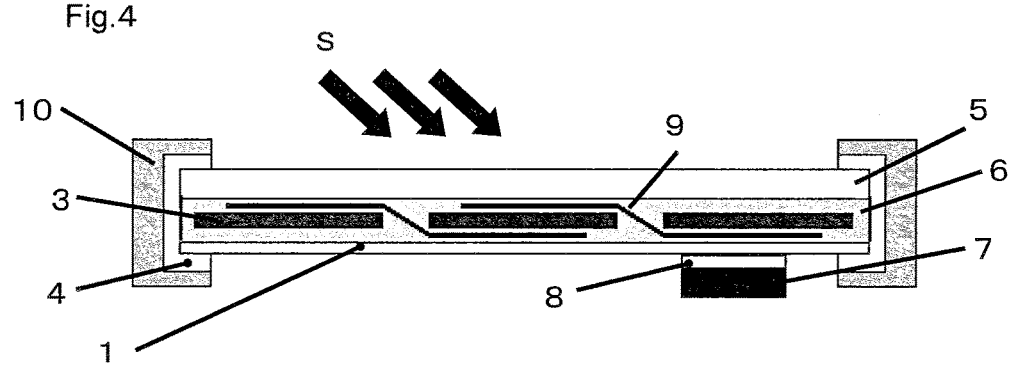
FIG. 4 is a schematic cross-sectional view of a photovoltaic module.

In a photovoltaic module including the back sheet for photovoltaic module of the first or the second construction, as illustrated in FIG. 4, a glass (5), serving as a light-receiving-side protective substrate configured to receive sunlight (S), an encapsulant (6), photovoltaic cells (3) connected in series via wires (9), and a back sheet (1) for photovoltaic module are superposed on each other and integrated. The integration is typically carried out through a thermocompression bonding process, called vacuum lamination. One of the wires (9) is drawn out from the backside of the module, and electricity is drawn through a terminal box attached with an adhesive. Typically, frames (10) made of a material such as aluminum are attached to the long sides and the short sides of the rectangular photovoltaic module with an adhesive (4).

The back sheet for photovoltaic module will be described with reference to FIG. 1. The back sheet (1) for photovoltaic module has a layer C (11) that will be bonded to an encapsulant when the back sheet is incorporated into a photovoltaic module of a substrate film (2). In the first construction, the number of the substrate film (2) is one. The layer C (11) preferably contains an acrylic resin.

Figure 2:
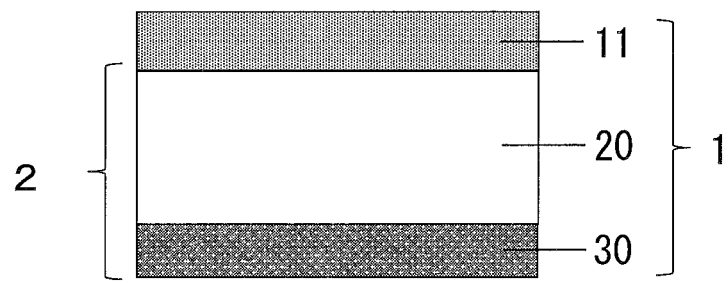
FIG. 2 is a schematic cross-sectional view of an example of the back sheet for photovoltaic module.

FIG. 2 is a schematic view of the back sheet for photovoltaic module according to the first construction. The back sheet (1) for photovoltaic module has the substrate film (2) composed of a single polyester film including a layer A (30) and a layer B (20), and the layer C (11) that will be bonded to an encapsulant when the back sheet is incorporated into a photovoltaic module.

Figure 3:
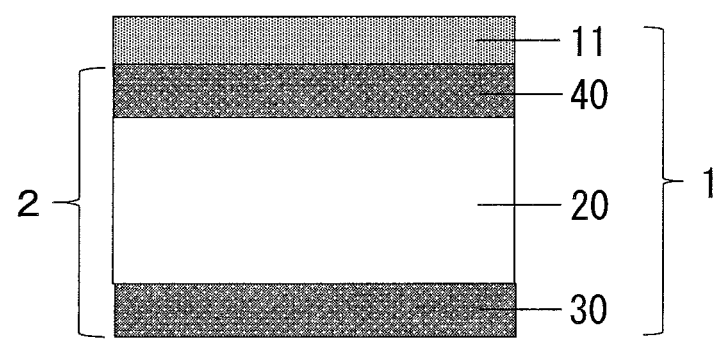
FIG. 3 is a schematic cross-sectional view of an example of the back sheet for photovoltaic module.

With reference to FIG. 3, the back sheet (1) for photovoltaic module has the substrate film (2) composed of a single polyester film including the layer A (30), the layer B (20), and a layer D (40), and the layer C (11) that will be bonded to an encapsulant when the back sheet is incorporated into a photovoltaic module.

Substrate Film

In both the first and second constructions, the substrate film constituting the back sheet for photovoltaic module may be a polyester film, which has high mechanical strength, dimensional stability, and thermal stability and is relatively inexpensive. Specific examples include polyester films such as polyethylene terephthalate (PET) films and polyethylene naphthalate (PEN) films. In particular, PET films, comprising polyethylene terephthalate as a major component, are preferred because they have high mechanical strength, dimensional stability, and thermal stability and are suitable as an object to be provided with processability and weather resistance.

The polyester film used as a substrate film preferably has high hydrolysis resistance. This is because photovoltaic modules are used in environments where they are directly exposed to the weather, and thus it is important to retain the long-lasting adhesive strength to the backside encapsulant, the adhesive strength at layer interfaces (the interface between the layer A and the layer B in the first construction, and the interface between the substrate film and the layer C in both the first and second constructions) in the structure of the back sheet for photovoltaic module, and the interlayer adhesive strength between the back sheet for photovoltaic module and the encapsulant; and to retain these adhesive strengths, the polyester resin constituting the substrate film preferably undergoes little moist-heat degradation. Polyester films, which are typically formed from polymers obtained by polycondensation of monomers, contain approximately 1.5% to 2% by mass of oligomers, which are categorized between monomers and polymers and represented by cyclic trimers. In contrast, hydrolysis-resistant films contain polyester resins obtained by solid phase polymerization, and the amount of cyclic trimer oligomer in the polyester resins is 1.0% by mass or less. Use of such polyester resins can inhibit the hydrolysis at a high temperature and high humidity and further provide a film with high heat resistance and weather resistance.

Furthermore, the polyester resin constituting the substrate film preferably has a number average molecular weight of 10,000 to 40,000. Resins having an intrinsic viscosity, as measured in o-chlorophenol at 25° C., of $5\times10^{-5}$ m$^3$/g or more are preferred. Such a molecular weight provides high hydrolysis resistance.

The substrate film preferably, but not necessarily, has a thickness of 75 to 300 μm, in terms of, for example, the withstand voltage properties and partial discharge voltage properties of the back sheet for photovoltaic module, the stiffness of the back sheet for photovoltaic module, which stiffness influences the handleability during the process of assembling a photovoltaic module, and cost.

Furthermore, the substrate film, whether it is monolayered or multilayered, preferably contains 1% by mass to 25% by mass of a white pigment. Any white pigments such as organic white pigments and inorganic white pigments can be used. In view of stable coloring, durability, and UV absorptivity over a long period of time, inorganic white pigments, such as zinc oxide, antimony trioxide, and titanium oxide, are preferred. Of these, titanium oxide is preferred in view of UV resistance. Rutile-type titanium oxide is more preferred. It is also preferable to use a titanium oxide whose surface is coated with an inorganic oxide such as alumina or silica.

In addition to the white pigment, the substrate film may optionally contain additives such as antistatic agents, UV absorbers, stabilizers, antioxidants, plasticizers, lubricants, fillers, and coloring pigments.

Substrate Film According to First Construction

The back sheet for photovoltaic module has a single substrate film. The substrate film has a layer A and a layer B.

The layer A contains a polyester resin as a major component, contains a white pigment in an amount of 5.0% by mass to 25% by mass based on the total amount of the layer A, has a thickness of 5 μm or more, and is disposed on a surface of the back sheet opposite to the layer C.

The layer B contains a polyester resin as a major component, contains a white pigment in an amount of 1.0% by mass to less than 5.0% by mass based on the total amount of the layer B, has a thickness accounting for 70% or more of the total thickness of the back sheet.

Layer A

The substrate film has at least a layer A and a layer B. The layer A is disposed on one surface of the back sheet. The layer A will be described first.

In a photovoltaic module including the back sheet for photovoltaic module, the layer C is disposed facing the backside encapsulant, and hence the layer A is disposed on the rearmost surface of the photovoltaic module. When such a photovoltaic module is installed outdoors over a long period of time, particularly, obliquely on the ground as in recent mega-solar power plants, the layer A on the rearmost surface of the photovoltaic module is exposed to UV radiation scattering in the atmosphere or reflected from the ground. If a photovoltaic module whose weather resistance at the rearmost surface is poor is installed over a long period of time of 20 or 30 years, the back sheet for photovoltaic module is gradually degraded by UV radiation, which may impair the maintenance of the protection provided by the back sheet for photovoltaic module. To retain the protection provided by the back sheet for photovoltaic module for a long period of time, the weather resistance of the layer A is extremely important.

The layer A comprises a polyester resin as a major component. The phrase "comprises a polyester resin as a major component" as used herein means that the polyester resin is contained in an amount of 50% by mass to 100% by mass based on 100% by mass of the total components of the layer. The upper limit is preferably 95% by mass or less.

The layer A preferably contains 5.0% by mass to 25% by mass of a white pigment.

Examples of white pigments and preferred white pigments include those listed in the section of Substrate Film.

The number average primary particle size of a white pigment, as determined by electron microscopy, is preferably 0.1 to 1.0 μm from the standpoint of the uniformity in coloring and UV absorptivity, more preferably 0.2 to 0.5 μm from the standpoint of dispersibility in the polyester resin in the layer A and cost.

It is preferable to contain 5.0% by mass to 25% by mass of a white pigment by selecting a white pigment in such an amount or with such an average particle size. A white pigment in an amount in the above range is dispersed like islands in the polyester resin, allowing the polyester resin to form a sea-like continuous phase, which leads to development of sufficient cohesive strength.

When the amount of white pigment in the layer A is small, UV radiation reaching the layer A is less likely to collide against the white pigment, as a result of which the UV radiation may significantly degrade the polyester resin, the main component of the layer A. In such cases, the polyester resin at the rearmost surface of the back sheet for photovoltaic module may be degraded by the UV radiation to cause problems such as yellowing, a decrease in mechanical strength, a reduction in layer thickness, and cracks. When the amount of white pigment in the layer A is too large, sufficient UV absorptivity is exhibited, but the layer A may have low toughness and low strength in the thickness direction because of the large proportion of white pigment in the polyester resin. In such cases, the layer A, which will be disposed at the rearmost surface when the back sheet is incorporated into a photovoltaic module, may disadvantageously have low adhesive strength to a terminal box, which will be bonded to the layer A with an adhesive such as a silicone resin, or undergo a cohesive failure when adhesive tape is removed that has been applied to secure a cable to the layer A to prevent the cable from being loosened during transport, for example.

The layer A preferably has a thickness of at least 5 μm. The preferred amount of white pigment in the layer A is as described above. Among the properties that the back sheet for photovoltaic module requires, mechanical strength, electrical insulation, and durability of these properties depend mainly on the layer B described below, which accounts for a large proportion of the total thickness. Thus, the layer A preferably has a function to protect the layer B against UV radiation, which may cause UV degradation, and a function to protect the layer B against moisture (water vapor) in the air, which may cause a hydrolysis reaction. Of these functions, the function to protect against UV radiation is a UV-radiation-blocking function of the layer A. Thus, the amount of white pigment in the layer A is preferably 5.0% by mass to 25% by mass, and in view of the UV-radiation-blocking rate per unit thickness, the thickness of the layer A is preferably at least 5 μm. With regard to the function to protect against water vapor in the air, it is known that the water vapor permeability of a polyester resin layer is inversely proportional to the thickness of the polyester resin layer. Thus, the layer A preferably has a thickness of at least 5 μm in terms of the water vapor barrier properties per thickness of a polyethylene terephthalate resin or a polyethylene naphthalate resin.

The substrate film for use in the back sheet has at least the layer A and the layer B containing different components at different ratios. In terms of economic efficiency, the substrate film is preferably formed by melt-extruding two raw materials from two extruders and costretching the extrudates. When such a process is used, it is difficult to stably form a film including an extremely thin layer A with minimal unevenness in film thickness. From this standpoint, the thickness of the layer A is preferably at least 5 μm. There is no upper limit to the thickness of the layer A, but if the thickness of the layer A is excessively large, the proportion of the layer B in the total thickness must be reduced in some cases. In such cases, the back sheet for photovoltaic module may have low hydrolysis resistance, and thus the thickness of the layer A is preferably up to 70 μm.

Layer B

As described above, the substrate film has the layer A (30) and the layer B (20). The thickness of the layer B accounts for 70% or more of the total thickness of the back sheet. The layer B, when having a thickness accounting for 70% or more of the total thickness of the back sheet, can provide the back sheet with mechanical strength and electrical insulation. The layer B will be described below.

The layer B comprises a polyester resin as a major component. The phrase "comprises a polyester resin as a major component" as used herein means that the polyester resin is contained in an amount of 50% by mass to 100% by mass based on 100% by mass of the total components of the layer. The upper limit is preferably 99% by mass or less.

When a photovoltaic module in which the back sheet for photovoltaic module is bonded is installed outdoors over a long period of time, particularly, in a hot and humid environment, the moist-heat resistance of the back sheet for photovoltaic module is important from the standpoint of durability. It is known that the moisture in the atmosphere is adsorbed onto the surface of the back sheet for photovoltaic module and diffused in the thickness direction of the back sheet for photovoltaic module to intrude into the module. It is known that the layers constituting the back sheet for photovoltaic module reacts with the moisture, in particular, the polyester resin undergoes a hydrolysis reaction. The hydrolysis reaction decreases the molecular weight of the polyester resin, leading to reduced mechanical strength, for example. When the hydrolysis reaction has proceeded too far, properties such as tensile strength at break and tensile elongation at break are reduced. The polyester resin constituting the back sheet for photovoltaic module is preferably a polyester resin obtained by solid phase polymerization containing 1.0% by mass or less of cyclic trimer as described above, and, for example, hydrolysis-resistant polyester films formed from such a polyester resin are suitable for use.

We further discovered that a white pigment in an amount of less than 5.0% by mass in the layer in the polyester resin film can retain good hydrolysis resistance. In other words, the layer B of the substrate film for use in the back sheet contains a white pigment in an amount of 1.0% by mass to less than 5.0% by mass based on the total amount of the layer B. An excessively large amount of white pigment in the layer B constituting the back sheet for photovoltaic module, although improving the light reflectance of the back sheet for photovoltaic module due to visible-light-reflecting characteristics of the white pigment, may reduce the hydrolysis resistance. In addition, an excessively large amount of white pigment increases the risk of the formation of micropores (voids) around the white pigment during the formation of the polyester film. A large number of pores (voids) in the layer B accounting for 70% or more of the total thickness of the back sheet for photovoltaic module may affect electrical characteristics or flame resistance. Less than 5.0% by mass of a white pigment allows the polyester resin, the main component of the substrate film, to maintain its intrinsic hydrolysis resistance, eliminating the risk of significant increase in the risk of the formation of pores (voids). However, when the amount of white pigment in the layer B is excessively small, the amount of pigment having light reflectivity in the layer B accounting for 70% or more of the total thickness of the back sheet for photovoltaic module is excessively small, which may reduce light reflection properties that contribute to the electric power generation properties of the photovoltaic module.

When the layer B accounts for 70% or more of the total thickness of the back sheet for photovoltaic module, light reflection properties sufficient for practical use are developed due to the amount of white pigment in the layer B, and mechanical strength, electrical insulation, and moist-heat resistance of the entire back sheet for photovoltaic module are achieved. When the thickness of the layer B relative to the total thickness of the back sheet is small, the proportion of the thickness of the layer A and the layer C, which contain a high concentration of white pigment, is large. Such a configuration may reduce moist-heat resistance and mechanical strength and increase the cost. The thickness of the layer B is preferably 90% or less of the total thickness of the back sheet. This is because if the layer B accounts for more than 90% when a thick film including a substrate film with a thickness of more than 200 μm is formed by lamination using two or more extruders, the extrusion relies on a specific extruder, and the capacity of other extruder(s) is not fully used, which may result in poor productivity.

The thickness of the layer B is preferably at least 50 μm from the standpoint of mechanical properties and electrical insulation of the substrate film and durability of these properties.

To the layer A and the layer B of the substrate film constituting the back sheet for photovoltaic module, additives such as antistatic agents, UV absorbers, stabilizers, antioxidants, plasticizers, lubricants, fillers, and coloring pigments can optionally be added in addition to the white pigment to the extent that the desired effects are not adversely affected.

While examples of the layer A and the layer B of the substrate film have been described above, these examples are preferred also with regard to the substrate film according to the second construction.

Method of Producing Substrate Film

The substrate film having the layer A and the layer B characterized by the back sheet for photovoltaic module can be produced by any known method. For example, a method can be used in which polyester resins, the main components of the layer A and the layer B, are dried as required, and the polyester resins fed from different flow channels using two or more extruders are laminated into a multilayer using an apparatus such as a multi manifold die, a field effect diblock, a static mixer, or a pinol. These apparatuses may optionally be combined.

The multilayered sheet is discharged through the die onto a cooling body, such as a casting drum, where the sheet is solidified by cooling to give a cast sheet. In this case, the multilayered sheet is preferably solidified by rapid cooling such that the sheet is brought into close contact with the cooling body, such as a casting drum, by electrostatic force using a wire-like, tape-like, needle-like, or knife-like electrode.

The cast sheet thus obtained is preferably subjected to biaxial stretching. The biaxial stretching refers to a stretching in the longitudinal direction and the transverse direction. The stretching may be performed sequentially or simultaneously in the two directions. Furthermore, re-stretching may be performed in the longitudinal and/or transverse direction.

To disperse a predetermined amount of white pigment into the layer(s) of the substrate film, whether the film is monolayered or multilayered, any known technique can be used. A description will be given of a method for adding a white pigment with a number average primary average particle size of 0.1 to 1 μm to the substrate film and uniformly dispersing the pigment in the film. The white pigment is preferably added by compounding. Specifically, large amounts (e.g., 50% by mass) of a titanium oxide pigment is added to a polyester resin to prepare a master chip, and the master chip is diluted to a desired concentration. In this case, dispersion aids can be used, and polyalkylene glycols or copolymers thereof can be used. Specifically, for example, polyethylene glycol, polypropylene glycol, and polybutylene terephthalate-polytetramethylene glycol copolymers are suitable for use.

The substrate film may be provided with a thin metal layer or a layer of, for example, an inorganic oxide by vapor deposition or any other method to impart water vapor barrier properties. Since the back sheet for photovoltaic module requires high electrical insulation, it is preferable to form a water-vapor-blocking layer including an inorganic oxide layer rather than a thin metal layer, which is electrically conductive.

Furthermore, the substrate film may optionally be subjected to a discharge treatment such as corona discharge or plasma discharge, or a surface treatment, such as acid treatment.

Layer C

The back sheet for photovoltaic module according to the first and second constructions has a substrate film and a layer C. This layer C is disposed on one surface of the back sheet. Due to this configuration, the layer C will be bonded to a backside encapsulant when a photovoltaic module is produced using the back sheet for photovoltaic module. The layer C will be described below.

The layer C comprises an acrylic resin as a major component. The phrase "comprises an acrylic resin as a major component" as used herein means that the acrylic resin is contained in an amount of 50% by mass to 100% by mass based on 100% by mass of the total components of the layer. The lower limit is preferably 60% by mass. Based on the amount of organic matter, the amount of acrylic resin is preferably 50% by mass or more, more preferably 60% by mass or more. The upper limit is preferably 90% by mass or less of the total components of the layer.

The layer C of the back sheet for photovoltaic module is often used bonded to a backside encapsulant in a photovoltaic module, and thus light including UV radiation passed through a space between a photovoltaic cell and a photovoltaic cell will reach the layer C surface of the back sheet for photovoltaic module. Depending on the wavelength of the light, the composition of the layer C, and the binding energy of each bond in the repeating structure, the layer may undergo a photodegradation reaction. When light passes through the encapsulant and the layer C, the substrate film layer adjacent to the layer C also may undergo a photodegradation reaction.

In assembling a photovoltaic module, the encapsulant (backside encapsulant in this case) such as an EVA resin sheet, and the layer C must be strongly bonded together by thermocompression bonding, and it is important to maintain or further improve the adhesive strength between the encapsulant and the layer C. Hence, the resin of the layer C is selected taking weather resistance and adhesion into account. Thus, in the first and second constructions, an acrylic resin, which has relatively high weather resistance, is preferably used as a main component in addition to a polyester resin, an olefin resin, and a urethane resin. Advantageously, acrylic resins, when prepared from monomers optimally selected, combined, and blended, tend to improve the adhesive strength to the substrate film and the dispersibility in or compatibility with other polymers.

Encapsulants for use in photovoltaic modules (a light-receiving-side encapsulant and a backside encapsulant), which are typically transparent sheet members comprising EVA resins as a major component, are often made of materials containing UV absorbers. Typically, when a photovoltaic module is assembled, photovoltaic cells connected in series with wires are sandwiched between two sheets of encapsulant so that the photovoltaic cells are protected and embedded. In such a photovoltaic module including two sheets of encapsulant each containing a UV absorber and having a thickness of about 400 to 600 μm, the amount of UV radiation reaching the surface of a back sheet for photovoltaic module from the light-receiving side is by far smaller than the amount of UV radiation reaching a light-receiving-side protective substrate, such as glass, typically, 10% or less of the amount of UV radiation reaching the light-receiving-side protective substrate. However, when a photovoltaic module including the back sheet for photovoltaic module according to the first construction bonded to the rearmost surface is installed outdoors for a long period of time for electric power generation, UV radiation keeps on reaching the back sheet even if the transmittance is 10% or less. Thus, if the layer C itself does not have high weather resistance and block UV radiation, the UV radiation may reach the polyester film, which is the underlayer of the layer C, to cause UV degradation of the polyester resin. We found that when the layer C transmits more than 50% of light at 350 nm wavelength, UV radiation may degrade and discolor mainly the substrate film, leading to a great change in color tone of the layer C surface of the back sheet for photovoltaic module and a decrease in mechanical strength of the back sheet for photovoltaic module. In contrast, when the light transmittance through the layer C is 50% or less at 350 nm wavelength, photodegradation of the polyester film can be reduced, resulting in reduced likelihood of discoloration and a decrease in mechanical strength. The phenomenon where the layer C transmits light at 350 nm wavelength makes no contribution to the development of functions of both the back sheet for photovoltaic module and the photovoltaic module, and thus the light transmittance through the layer C at 350 nm wavelength may be 0% depending on the composition and the design of the layer C. That is to say, in the back sheet for photovoltaic module according to the first construction, the layer C preferably has a light transmittance at 350 nm wavelength of 0% to 50%.

A light transmittance at 350 nm wavelength of the layer C of 50% or less can be achieved, for example, by adding a UV absorber into the layer C. Organic UV absorbers can be used. Organic UV absorbers, however, may move to an encapsulant layer, and hence inorganic UV absorbers, which are less likely to move to other layers and have long-term stability, and polymeric UV absorbers, which include chemical bonds to polymers, are suitable for use. Examples of inorganic UV absorbers include titanium oxide, zinc oxide, and cerium oxide. These metal oxides are suitable for their UV absorptivity, durability, versatility, and other properties, and rutile-type titanium dioxide, which has a high refractive index, excellent blocking properties, and good weather resistance, are particularly suitable for use. That is to say, the layer C of the back sheet for photovoltaic module according to the first and second constructions preferably contains UV absorbers.

When the layer C contains an inorganic UV absorber, the amount of UV absorber is preferably 10% by mass to 50% by mass of the total components of the layer C. When the amount of UV absorber is in this range, the UV-radiation-blocking effect and adhesion to encapsulant can be simultaneously achieved, and in addition, the layer C, if formed by the method described below, has high film stability although the inorganic UV absorber, which has a higher specific gravity than acrylic resins, is contained.

The acrylic resin, the main component of the layer C, will now be described. The acrylic resin preferably used for the layer C is a polymer containing, in its repeating structure, at least one component derived from an acrylic monomer. That is to say, the acrylic resin refers to a polymer prepared from at least one acrylic monomer and may be a copolymer prepared from a plurality of monomers including at least one acrylic monomer. The acrylic monomer refers to acrylic acid and esters thereof, and methacrylic acid and esters thereof. Examples of acrylic acid esters and methacrylic acid esters include methyl methacrylate, methyl acrylate, and ethyl acrylate, and methyl methacrylate and methyl acrylate are particularly preferred from the standpoint of versatility, price, and light stability.

Examples of monomers, other than acrylic monomers, for copolymerization that can be used to prepare an acrylic resin include unsaturated carboxylic acids such as maleic acid and itaconic acid, unsaturated carboxylic acid anhydrides such as maleic anhydride, unsaturated hydrocarbons such as butadiene and ethylene, and vinyl esters such as vinyl acetate.

Into the layer C, reactive functional groups may be introduced, and also a cross-linking agent that can react with the reactive functional groups may be added to introduce a cross-linked structure, for the following two reasons:

(i) To improve the heat resistance of the layer C, for the back sheet for photovoltaic module according to the first construction is subjected to high-temperature treatments in the process of producing a photovoltaic module; and (ii) To prevent embrittlement of the layer C due to the addition of a white pigment and improve the toughness and strength of the layer C, which addition may be carried out in order, for example, to improve the UV-radiation-blocking properties of the layer C.

Examples of reactive functional groups introduced into the layer C for these purposes include hydroxyl, carboxyl, amino, glycidyl, and silyl, among which an appropriate group is selected according to the ease of formation of the resin layer and the mode of reaction for forming a cross-linked structure. In particular, groups reactive with isocyanate compounds described below, that is, groups reactive with isocyanate groups are preferred. In terms of good reactivity, hydroxyl, cyano, glycidyl, and silyl are preferred, and particularly in terms of availability of the resin and good reactivity, hydroxyl is preferred. These reactive functional groups are typically introduced into an acrylic resin by copolymerizing a monomer containing reactive functional groups. That is to say, the layer C preferably contains an acrylic resin having a functional group reactive with an isocyanate group, particularly, an acrylic resin having hydroxyl groups, and the layer C is preferably a layer obtained using a composition containing the acrylic resin having hydroxyl groups. The acrylic resin having hydroxyl groups, as a result of reaction with an isocyanate compound, becomes an acrylic resin containing urethane linkage.

A description will be given of monomers used to prepare the acrylic resin having hydroxyl groups. Examples of monomers used to introduce hydroxyl groups into an acrylic resin include hydroxyl-containing acrylic monomers such as 2-hydroxyethyl acrylate, 2-hydroxyethyl methacrylate, and 2-hydroxypropyl acrylate, hydroxyl-containing vinyl ethers such as 2-hydroxyethyl vinyl ether and 3-hydroxypropyl vinyl ether, and hydroxyl-containing allyl ethers such as 2-hydroxyethyl allyl ether. These monomers for introducing hydroxyl groups can be used alone or in a combination of two or more. The acrylic resin having hydroxyl preferably has a hydroxyl value, on a solids basis, of 2 to 100 mgKOH/g, more preferably 2 to 50 mgKOH/g, still more preferably 2 to 30 mgKOH/g. An excessively large hydroxyl value of the acrylic resin tends to increase the crosslink density of the layer C, leading to reduced adhesive strength to the substrate film. An excessively small hydroxyl value decreases the crosslink density of the layer C, leading to reduced moist-heat resistance.

A description will now be given of a cross-linking agent that can be added into a layer-C-forming composition made of an acrylic resin composition. This cross-linking agent binds to the functional group of an acrylic resin having a reactive functional group in the composition to form a cross-linked structure. This can improve the heat resistance of the layer and prevent embrittlement. In addition to the improvement in heat resistance, toughness, and strength of the layer C due to the formation of a cross-linked structure, the cross-linking agent can provide an improvement in adhesive strength between the substrate film and the layer C.

Since the acrylic resin having hydroxyl groups is particularly suitable for use, it is preferable to use a cross-linking agent that can react with the hydroxyl groups. It is particularly preferred that an isocyanate compound be used as a cross-linking agent to form urethane linkage, thereby forming a cross-linked structure. That is to say, the layer C is preferably a layer made from the acrylic resin having hydroxyl groups, the isocyanate compound, and the layer-C-forming material composition optionally containing a white pigment.

The isocyanate compound suitable as a cross-linking agent is preferably a compound having more than one isocyanate group. Examples of the suitable isocyanate compound include aromatic polyisocyanates, araliphatic polyisocyanates, alicyclic polyisocyanates, and aliphatic polyisocyanates. Resins obtained from isocyanates containing aromatic rings in their backbones, which isocyanates each have an absorption band in the UV light region, are subject to yellowing when exposed to UV irradiation, and thus it is preferable to use a cross-linking agent comprising an alicyclic polyisocyanate or an aliphatic polyisocyanate as a major component. These compounds are prepared from diisocyanate compounds described below.

Examples of diisocyanates for use as a raw material for alicyclic polyisocyanates include 1,4-cyclohexane diisocyanate and 3-isocyanatomethyl-3,5,5-trimethylcyclohexyl isocyanate (isophorone diisocyanate; IPDI).

Examples of diisocyanates for use as a raw material for aliphatic polyisocyanates include trimethylene diisocyanate, tetramethylene diisocyanate, and hexamethylene diisocyanate (HDI).

As raw materials for polyisocyanates, these diisocyanates can be used in combination, and modified products such as biuret-modified products and nurate-modified products can also be used.

To form a cross-linked structure between the isocyanate compound and the acrylic resin having a reactive functional group such as hydroxyl group, a curing process in which heat is applied is typically employed. Curing conditions, although varying depending on the combination of the type of acrylic resin and the type of isocyanate compound, are, for example, 50° C. for about three days. In this curing process, a cross-linking reaction proceeds between the isocyanate compound and hydroxyl groups in the acrylic resin having hydroxyl groups to form an acrylic resin having urethane linkage, thereby improving the strength and toughness of the layer C.

Furthermore, in the back sheet for photovoltaic module, the layer-C-forming material preferably contains a blocked isocyanate compound and an isocyanate compound not protected by blocking groups in order to enhance the interfacial adhesions between the layer C and the substrate film and between the layer C and the encapsulant. That is to say, the layer-C-forming material preferably contains two or more isocyanate compounds, the isocyanate compounds including a blocked isocyanate compound having isocyanate groups protected by blocking groups and an isocyanate compound having isocyanate groups not protected by blocking groups. The presence of such two or more isocyanate compounds is the feature of the second construction.

The blocked isocyanate compound is formed by blocking isocyanate groups in an isocyanate compound with blocking groups, and upon heating, the blocking groups are eliminated to form isocyanate groups, facilitating the cross-linking reaction. Thus, below the temperature necessary for the blocking groups to be eliminated, the reaction does not proceed, and the properties of the resin layer are stable, leading to increased storage stability.

Thus, if a layer-C-forming material is used containing two or more isocyanate compounds including a blocked isocyanate compound having isocyanate groups protected by blocking groups and an isocyanate compound having isocyanate groups not protected by blocking groups, the resulting layer C in a back sheet will be a layer containing an acrylic resin having hydroxyl groups, an acrylic resin having urethane linkage, an isocyanate compound (blocked isocyanate compound), and a white pigment. That is to say, during the process of producing the back sheet, the isocyanate compound having isocyanate groups not protected by blocking groups in the layer-C-forming material undergoes a cross-linking reaction with an acrylic resin to give the acrylic resin having urethane linkage. In contrast, the blocked isocyanate compound does not undergo a reaction during the process for producing the back sheet and remains in the layer C unreacted. Thus, the layer C of the back sheet for photovoltaic module is preferably a layer containing an acrylic resin having hydroxyl groups, an acrylic resin having urethane linkage, an isocyanate compound (blocked isocyanate compound), and a white pigment. The amount of the blocked isocyanate compound having isocyanate groups protected by blocking groups is preferably 0.1 part by mass to 20 parts by mass based on 1 part by mass of the isocyanate compound having isocyanate groups not protected by blocking groups.

The layer-C-forming material composition can contain a solvent. In the layer-C-forming material composition, the amount of acrylic resin based on the amount of components excluding the solvent (referred to as "solid content" in this paragraph) is preferably 40% by mass or more, more preferably 50% by mass or more, still more preferably 60% by mass or more. The upper limit is preferably 90% by mass or less. When the layer-C-forming material composition contains an isocyanate compound, the ratio of isocyanate group to hydroxyl group in the acrylic resin is preferably 0.1:1 to 5:1. When an isocyanate compound is added, the amount thereof is preferably 0.01% to 5% by mass based on the solid content of the layer-C-forming material composition. When the layer C contains a white pigment, the amount thereof is preferably 10% to 50% by mass, more preferably 10% to 45% by mass, still more preferably 10% to 40% by mass, based on the solid content of the layer-C-forming material composition.

Examples of agents for blocking isocyanate groups used to prepare a blocked isocyanate compound include, but are not limited to, ε-caprolactams, phenols, cresols, oximes, and alcohols. Among blocked isocyanate compounds, non-yellowing blocked isocyanate compounds, having no isocyanate group directly bonded to an aromatic ring, are preferred to prevent yellowing of the layer C.

A photovoltaic module including the photovoltaic module according to the first or second construction is obtained by disposing, in sequence, a light-receiving-side protective substrate, a light-receiving-side encapsulant, cells, a backside encapsulant, and a back sheet such that the layer C of the back sheet faces the backside encapsulant, thereby forming a layered product, and laminating the layered product. For the lamination, vacuum lamination is typically used, and in bonding the layers in this vacuum lamination process, heat necessary for blocking groups to be eliminated is applied. During the vacuum lamination process, elimination of blocking groups, formation of isocyanate groups, and a cross-linking reaction with components in the encapsulants are caused, leading to robust and stable adhesive strength that lasts from the initial stage to after durability testing, and further under outdoor exposure conditions.

The layer C can be formed by laminating or applying the layer-C-forming material composition ((I) or (II)) that has been melted by heat or dispersed in water during the process for forming a substrate film, or applying a coating liquid of the layer-C-forming material in a solvent, such as water or an organic solvent, to a substrate film. In particular, the method of forming the layer C by applying a coating liquid of the layer-C-forming material dispersed or dissolved in an organic solvent is highly productive and provides the layer C with high quality stability. In forming the layer C by applying a coating liquid, the coating liquid is applied to a substrate film and then dried by heating, and optionally cured, for example, by UV irradiation. The application can be carried out by a known method such as gravure coating or roll coating. When the layer C is formed by a wet coating method, heating and drying in the drying step after the application can be carried out in a drying oven set at a high temperature of 150° C. or higher, whereby not only the layer C can be formed, but also the heat shrinkage of the back sheet for photovoltaic module according to the first construction can be reduced, which is economically advantageous.

Examples of the solvent of the coating liquid when the layer C is formed by a wet coating method include toluene, ethyl acetate, butyl acetate, methyl ethyl ketone, methyl isobutyl ketone, and water. The coating liquid may be in the form of an emulsion or a solution.

The thickness of the layer C is preferably, but not necessarily, 0.2 µm to less than 3 µm. A thickness of the layer C of 0.2 µm to less than 3 µm is less likely to cause appearance defects such as pinholes particularly when the layer C is formed by a wet coating method, and enables application under conditions where the amount of dilution solvent and the like to be volatilized is relatively small, leading to high drying efficiency, an increased application rate, and high economic efficiency.

The back sheet for photovoltaic module according to the first and second constructions, when cut to a size of 20 cm×20 cm and heated at 150° C. for 30 minutes, preferably exhibits a warpage of up to 30 mm at each of four corners of the sheet. Photovoltaic modules are typically produced, as described below, by disposing, in sequence, a light-receiving-side protective substrate, a light-receiving-side encapsulant, cells, a backside encapsulant, and a back sheet such that the encapsulant-receiving side of the back sheet faces the backside encapsulant, thereby forming a layered product, placing the layered product in an apparatus called a vacuum laminator equipped, for example, with a heatable hot plate and a depressurizing pump, and then laminating the layered product. In this process, when the layered product at normal temperature is conveyed onto the hot plate of the vacuum laminator heated to a temperature of about 130° C. to 160° C., the temperature of the hot plate decreases, and the layered product is heated ununiformly and unevenly, leading to uneven cross-linking of the encapsulant. This can cause a variation in the quality of photovoltaic modules. To overcome this problem, a method is used in which a layered product is pre-heated before being conveyed into a vacuum laminator. The heat applied to a back sheet for photovoltaic module during the pre-heating may, however, cause the back sheet for photovoltaic module to curl, in which case, disadvantageously, the back sheet, during conveyance, comes into contact with the apparatus in conveyance channels, and the curled back sheet for photovoltaic module, after being conveyed into the vacuum laminator, is bent by a descending upper lid of the apparatus. In a back sheet for photovoltaic module including two or three films bonded together, if the films have different heat shrinkages, heat generates a force that tries to bend the back sheet for photovoltaic module toward the film having a greater heat shrinkage, thereby causing a curl. To avoid such a problem, the back sheet for photovoltaic module may be produced, for example, by reducing the heat shrinkages of the films constituting the back sheet for photovoltaic module in advance and then bonding the films with an adhesive. This method, however, involves multiple steps including the conveyance step, which may cause defects such as scratches, and is less productive and economical due to the increased number of steps. In contrast, the back sheet for photovoltaic module, which includes a single substrate film, has no risk of curling during heating, which curling is due to a difference in heat shrinkage between films, and causes less problems during the process for producing a photovoltaic module.

In the photovoltaic module according to the first construction, the layer A and the layer C preferably each have a Class 0 aggregate intensity of surface, as determined in accordance with a description in ISO2409 (2013). In the back sheet for photovoltaic module according to the first construction, the layer A and the layer C, which are at the surfaces, may rub against other members during the process for assembling a photovoltaic module. There are also steps of, for example, attaching a terminal box with an adhesive, and temporarily fastening a cable with an adhesive tape and peeling off the fastened tape when the photovoltaic module is installed. Thus, the layer A and the layer C of the photovoltaic module according to the first construction preferably each have an aggregate intensity of surface that can withstand the above rubbing and a physical stress caused when the adhesive tape is peeled off. Furthermore, the layer A and the layer C of the photovoltaic module preferably each have a high aggregate intensity of surface also because the terminal box attached with an adhesive, after being installed outdoors as a member of the photovoltaic module, needs to adhere closely to the surface of the back sheet for photovoltaic module for a long period of time. To achieve aggregate intensities of surface sufficient for the process for producing a photovoltaic module and for practical use, that is, to control the aggregate intensities of surface of the layer A and the layer C, as determined in accordance with the description in ISO2409 (2013), to be Class 0, the following examples are preferred.

The back sheet for photovoltaic module according to the first construction has a single substrate film and a layer C, the substrate film having a layer A and a layer B, wherein the layer A, the layer B, and the layer C are disposed in this order, and an additional layer may be present between the layer A and the layer B and between the layer B and the layer C. That is to say, the back sheet for photovoltaic module according to the first construction has the layer A, the layer B, the layer C, and optionally an additional layer(s) therebetween, provided that the layer C is disposed on one surface, and the layer A is disposed on the other surface. As shown in FIG. 3, for example, a layer (a layer D (40)) comprising a polyester resin as a major component may be disposed between the layer C (11) and the layer B (29). To further improve, particularly, the weather resistance on the encapsulant-receiving side and the light reflection properties of the back sheet for photovoltaic module, it is advantageous to design the back sheet such that a layer D containing a white pigment in an amount larger than that in the layer B is formed between the layer C and the layer B. The amount of white pigment in the layer D is preferably 5% by mass to 20% by mass based on 100% by mass of the total components of the layer D.

Photovoltaic Module

In both the first and second constructions, the photovoltaic module is produced by disposing, in sequence, a light-receiving-side protective substrate, a light-receiving-side encapsulant, cells, a backside encapsulant, and the back sheet for photovoltaic module obtained as described above such that the layer C of the back sheet faces the backside encapsulant, thereby forming a layered product, and laminating the layered product by heating. The heating temperature in the lamination step is preferably 120° C. to 180° C., more preferably 130° C. to 170° C., in view of the cross-linking reaction of the encapsulant layer and the blocking group elimination reaction of a blocked isocyanate compound.

Examples of the encapsulants (the light-receiving-side encapsulant, the backside encapsulant) for use in the photovoltaic module include, but are not limited to, EVA resins, polyvinyl butyral, and modified polyolefins. Of these, EVA resins are preferred from the standpoint of weather resistance, heat resistance, and material cost.

The use of the back sheet for photovoltaic module is not restricted by the type of electricity-generating layer, and the back sheet is suitable for use in any type of photovoltaic module.

EXAMPLES

Our back sheets and modules will be described in detail with reference to examples. In the examples, "part(s)" means "part(s) by mass" unless otherwise specified.

Methods of Property Evaluation

Methods of property evaluation used in the examples are as described below.

(1) Thicknesses of Layers

The total thickness of a laminate was measured in accordance with JIS C2151 (1990), and pretreatment was carried out by cutting the laminate cross-sectionally with a microtome. After that, the cross-section was micrographed using a field-emission scanning electron microscope (FE-SEM) S-800 available from Hitachi, Ltd. at a magnification (×1000) that allowed the whole cross-section to be imaged, and thicknesses in the micrograph of the cross-section were measured.

(2) Proportion of Thickness of Layer B in Total Thickness of Back Sheet for Photovoltaic Module (Thickness Proportion)

From the thicknesses of the layers measured in the micrograph of the cross-section by the method of (1) above, the proportion of the thickness of the layer B was calculated by the following equation.

Proportion of thickness of layer $B$ (%)=thickness of layer $B$/total thickness×100

(3) Titanium Oxide Contents of Layers

Using a back sheet for photovoltaic module as a sample, the amount of titanium element, characteristic of titanium oxide, was determined with an X-ray fluorescence elemental analyzer (Model MESA-500W available from Horiba, Ltd). The amount of titanium element was converted into a titanium oxide concentration.

(4) Light Reflectance

A Hitachi U-3310 spectrophotometer was used. A standard white plate of barium sulfate was used for both an opening for standard white plate and a test piece opening. The inclination angle of the test piece opening was set at 10°, and a diffuse reflectance (T0) was determined at 560 nm. This reflectance was taken as 100%. The standard white plate at the test piece opening was then replaced with a test piece, and a diffuse reflectance was determined at 560 nm. After that, the relative reflectance (R) was calculated by the following equation.

$R$ (%)=$T1/T0$×100

T0: Reflectance of standard white plate
T1: Reflectance of test piece (5) Transmittance of Layer C (Light Transmittance of Layer C at 350 nm Wavelength)

A Hitachi U-3310 spectrophotometer was used. A standard white plate of alumina was used for both an opening for standard white plate and a test piece opening. The inclination angle of the test piece opening was set at 10°, and a transmittance (AO) without a sample was determined at 300 to 350 nm. This transmittance was taken as 100%. After that, a film that absorbs little light in the UV region (hereinafter referred to as "ETFE film") (50 μm transparent) was disposed in front of incident light, and a transmittance at a wavelength of 300 to 350 nm was measured at every 5 nm to determine the transmittance at 350 nm (Tetfe). After that, the ETFE film with the layer C formed on was disposed, and the transmittance at 350 nm (Tetfe/c) was measured in the same manner. From these two transmittances, the transmittance T (%) of the layer C at a wavelength of 350 nm was calculated by the following equation.

$T$ (%)=$Tetfe/c$ (%)/$Tetfe$ (%)×100

(6) Evaluation of Aggregate Intensity of Surface (Cross-Cut Test)

Both surfaces (the layer A and the layer C) of a back sheet for photovoltaic module prepared were subjected to a cross-cut test by the method described in ISO2409 (2013) and classified according to "Table 1 Classification of test results" in ISO2409.

(7) Adhesive Strength to Encapsulant

The adhesive strength of a back sheet for photovoltaic module to an EVA sheet used as an encapsulant was measured in accordance with JIS K6854-2 (1999). The pseudo-photovoltaic module sample used for testing was obtained by laminating an EVA sheet on the layer C surface of a back sheet for photovoltaic module prepared, further laminating a 0.3-mm-thick sheet of semi-tempered glass thereon, reducing the pressure using a commercially available vacuum laminator, and then pressing the laminate at an elevated temperature of 142° C. under a load of 1 atmosphere for 15 minutes. The EVA sheet used was a 450-μm-thick sheet (Fast cure type) available from Sanvic Inc. Two test pieces 10 mm in width were used for adhesive strength testing, and measurements were made once for each test piece. The average of the two measurements was used as the adhesive strength.

Furthermore, the test piece subjected to the measurement of adhesive strength to encapsulant as described above was treated in a constant temperature and humidity oven available from Espec Corp. under conditions of a temperature of 85° C. and a relative humidity of 85% RH for 2,000 hours. After that, the adhesive strength to encapsulant after wet heat testing was determined by the method described above.

Adhesive strengths of 30 N/10 mm or more were considered to be practically acceptable.

(8) Measurement of Heat Shrinkage

A back sheet for photovoltaic module prepared was heat treated in an oven at 150° C. for 30 minutes in accordance with JIS C 2151 (2006), and the dimensional changes in the machine direction (MD) and the transverse direction (TD) before and after the heat treatment were determined. From the values of dimensional change obtained, the heat shrinkage was calculated by the following equation.

Heat shrinkage (%)={(length before heat treatment−length after heat treatment)/length before heat treatment}×100

(9) Measurement of Elongation at Break

The elongation at break was determined in accordance with ASTM-D882 (ANNUAL BOOK OF ASTM STANDARDS, 1999) such that a back sheet for photovoltaic module prepared was cut to a size of 1 cm×20 cm and drawn at a chuck distance of 5 cm and a tensile speed of 300 mm/min. The number of samples was 5, and measurements were made for the machine direction of the back sheet for photovoltaic module. The result was defined as an initial elongation at break E0.

(10) Retention of Elongation at Break after Wet Heat Testing

A sample was cut into the shape of a test piece (1 cm×20 cm) and then treated in a constant temperature and humidity oven available from Espec Corp. under conditions of a temperature of 85° C. and a relative humidity of 85% RH for 2,000 hours. After that, the elongation at break was determined according to Section (9) above. Measurements were made five times for the machine direction of the back sheet for photovoltaic module. The average value was defined as an elongation at break E1. Using the initial elongation at break E0 determined according to Section (9) above and the elongation at break E1 after wet heat testing, the retention of elongation at break was calculated by the following equation.

Retention of elongation at break (%)=$E1/E0$×100

The retentions of elongation obtained were evaluated as described below.

Retention of elongation at break of 50% or more: A
Retention of elongation at break of 40% to less than 50%: B
Retention of elongation at break of 30% to less than 40%: C
Retention of elongation at break of less than 30%: D

(11) Retention of Elongation at Break after Weather Resistance Testing

A back sheet for photovoltaic module prepared was cut to a size of 7 cm×20 cm and irradiated for 3,000 hours by repeating the following cycles 1 and 2 using an "SX-75" xenon weather meter available from Suga Test Instruments Co., Ltd. under conditions of a black panel temperature of 65° C., a relative humidity of 50% RH, and an illuminance of 180 W/m$^2$ (light source: xenon lamp, wavelength range: 300 to 400 nm). After that, the test piece subjected to UV irradiation testing was cut into a strip sample of 1 cm×20 cm, and then the elongation at break was determined according to Section (9) above.

Cycle 1: UV irradiation alone for 108 minutes
Cycle 2: UV irradiation and water spraying for 12 minutes (no humidity control during this cycle)

Measurements were made five times for the machine direction of the film. The average value was defined as an elongation at break E2. Using the initial elongation at break E0 determined according to Section (9) above and the elongation at break E2 after weather resistance testing, the retention of elongation at break was calculated by the following equation.

Retention of elongation at break (%)=$E2/E0$×100

The retentions of elongation obtained were evaluated as described below.

Retention of elongation at break of 50% or more: A
Retention of elongation at break of 40% to less than 50%: B
Retention of elongation at break of 30% to less than 40%: C
Retention of elongation at break of less than 30%: D

(12) Color Tone

The change in color tone of the layer A and the layer C of a back sheet for photovoltaic module after weather resistance testing was determined as follows: in accordance with JIS K 7105 (2006), the b-value in the color system was measured using a color meter available from Suga Test Instruments Co., Ltd. (SM color computer SM-6), and Δb (b-value (after testing)−b-value (before testing)), a difference in b-value before and after testing, was determined. The evaluation was made at n=2. Larger b-values indicate higher degrees of yellowing, and larger Δb-values indicate higher degrees of turning yellow, as compared to before testing.

(13) Heat-Curling Properties

A back sheet for photovoltaic module cut to a size of 20 cm×20 cm was placed flatly on a heatable hot plate with the layer C facing the hot plate, and the hot plate heated to 150° C. and left to stand for 30 minutes. An evaluation was made using warpage heights at four corners (vertical distances between each of the four corners and the hot plate) of the back sheet for photovoltaic module.

The warpage is 10 mm or less at all the four corners of the sheet: A
Not falling into either A or C: B
The warpage is over 30 mm at any of the four corners of the sheet: C Preparation of PET Polymer (a)

To 100 parts of terephthalic acid, used as a dicarboxylic acid component, 64 parts of ethylene glycol was added, and 0.1 part of zinc acetate and 0.03 part of antimony trioxide, serving as catalysts, were further added. Transesterification was carried out at the reflux temperature of ethylene glycol.

To the reaction product, 0.08 part of trimethyl phosphate was added. The resulting mixture was gradually heated and depressurized, and polymerization was carried out at 271° C.

for 5 hours. The resulting polyethylene terephthalate had an intrinsic viscosity of 0.55. The polymer was cut into chips with a length of 4 mm.

The PET was then placed in a rotary vacuum device (rotary vacuum dryer) under conditions of a high polymerization temperature of 220° C. and a reduced pressure of 0.5 mmHg and heated with stirring for 10 hours to undergo solid phase polymerization, thereby obtaining a PET polymer.

Preparation of PET Polymer (b) (Masterbatch Containing High Concentration of Titanium Oxide)

The PET polymer (a) prepared by the above-described method and titanium oxide (rutile-type, average particle size: 200 nm) were compounded to give a master chip containing 50% by mass of titanium oxide. This master chip was named a PET polymer (b). The master chip had a density of 2.5 g/cm$^3$. The master chip was formed into a cylindrical shape (length: 2.40 to 4.60 mm, width: 3.20 to 4.80 mm, and height: 1.70 to 2.30 mm).

Preparation of PET Polymers (c) to (m)

The PET polymer (a) and the PET polymer (b) prepared by the above-described method were mixed at composition ratios shown in Table 1 to obtain PET polymers (c) to (m), for use as resin materials for forming polyester films.

Preparation of Layer-C-Forming Materials C1 to C3

In a four-necked flask equipped with a condenser, a stirrer, a thermometer, and a nitrogen inlet tube, 18 parts of methyl methacrylate, 80 parts of n-butyl methacrylate, 2 parts of 2-hydroxyethyl methacrylate, and 100 parts of toluene were placed and heated to 100° C. with stirring in a nitrogen atmosphere. To the resulting mixture, 0.15 part of azobisisobutyronitrile was added, and polymerization reaction was carried out for 2 hours. Subsequently, 0.07 part of azobisisobutyronitrile was added, and polymerization reaction was carried out for another 2 hours. Furthermore, 0.07 part of azobisisobutyronitrile was added, and polymerization reaction was carried out for another 2 hours to thereby obtain a methacrylate copolymer solution.

Five parts of Eo-modified isocyanurate triacrylate ("ARONIX" (registered trademark) M-315 available from Toagosei Co., Ltd.) and 9.5 parts of isocyanurate of hexamethylene diisocyanate, blocked with 3,5-dimethyl pyrazole, were diluted with ethyl acetate to 75% by mass to prepare a polyisocyanate compound solution. The polyisocyanate compound solution in an amount of 9.5 parts was added to 100 parts of the above-described methacrylate copolymer solution to obtain an acrylic polymer solution (C1). To this solution, a titanium oxide pigment with an average particle size of 100 nm was added in an amount of 30% by mass, based on the resin solids, and a mixture of ethyl acetate and methyl isobutyl ketone (at a mass ratio of 1:1) was further added as a dilution solvent to a total solids concentration in the solution of 50% by mass, thereby obtaining a titanium-oxide-containing acrylic polymer solution (C2).

To 100 parts of the titanium-oxide-containing acrylic polymer solution (C2), 1 part of a curing agent solution containing hexamethylene polyisocyanate (HDI) ("N-3200" available from Sumika Bayer Urethane Co., Ltd.) was added as a polyisocyanate curing agent, and then methyl isobutyl ketone was further added to a total solids concentration of 20% by mass, thereby obtaining a layer-C-forming material composition (C3).

Preparation of Layer-C-Forming Material Compositions C4 and C5

Fifty parts of the titanium-oxide-containing acrylic polymer solution (C2) obtained by the above-described method were weighed out, and 50 parts of "HALS-HYBRID" (registered trademark) polymer UV-G13 available from Nippon Shokubai Co., Ltd., composed of an acrylic resin containing a UV absorber and a light stabilizer in the repeating structure of the polymer, was added thereto to obtain a titanium-oxide-containing acrylic polymer solution (C4). To 100 parts of the titanium-oxide-containing acrylic polymer solution (C4), 1 part of a curing agent solution containing hexamethylene polyisocyanate (HDI) (N-3200 available from Sumika Bayer Urethane Co., Ltd.) was added as a polyisocyanate curing agent, and then methyl isobutyl ketone was further added to a total solids concentration of 10% by mass, thereby obtaining a layer-C-forming material composition (C5).

Preparation of Layer-C-Forming Material Composition C6

The acrylic polymer solution (C1) obtained by the above-described method was diluted with methyl isobutyl ketone to a total solids concentration of 50% by mass. To 100 parts of the resulting acrylic polymer solution, 1 part of the above-described curing agent solution containing hexamethylene polyisocyanate (HDI) ("N-3200") was added, and then methyl isobutyl ketone was further added to a total solids concentration of 30% by mass, thereby obtaining a layer-C-forming material composition (C6).

Preparation of Layer-C-Forming Material Compositions C7 and C8

In a four-necked flask equipped with a condenser, a stirrer, a thermometer, and a nitrogen inlet tube, 18 parts of methyl methacrylate, 80 parts of n-butyl methacrylate, 2 parts of 2-hydroxyethyl methacrylate, and 100 parts of toluene were placed and heated to 100° C. with stirring in a nitrogen atmosphere. To the resulting mixture, 0.15 part of azobisisobutyronitrile was added, and polymerization reaction was carried out for 2 hours. Subsequently, 0.07 part of azobisisobutyronitrile was added, and polymerization reaction was carried out for another 2 hours. Furthermore, 0.07 part of azobisisobutyronitrile was added, and polymerization reaction was carried out for another 2 hours to thereby obtain a methacrylate copolymer solution.

To this solution, a titanium oxide pigment with an average particle size of 100 nm was added in an amount of 30% by mass, based on the resin solids, and ethyl acetate and methyl isobutyl ketone was added as a dilution solvent to a total solids concentration in the solution of 50% by mass, thereby obtaining a titanium-oxide-containing acrylic polymer solution (C7).

To 100 parts of the titanium-oxide-containing acrylic polymer solution (C7), 1 part of a curing agent solution containing hexamethylene polyisocyanate (HDI) ("N-3200" available from Sumika Bayer Urethane Co., Ltd.) was added as a polyisocyanate curing agent, and then methyl isobutyl ketone was further added to a total solids concentration of 20% by mass, thereby obtaining a layer-C-forming material composition (C8).

TABLE 1

| | | Titanium Oxide Concentration (% by mass) | | | | | | | | | |
|---|---|---|---|---|---|---|---|---|---|---|---|
| | | 28% by mass PET polymer (c) | 25% by mass PET polymer (d) | 18% by mass PET polymer (e) | 15% by mass PET polymer (f) | 10% by mass PET polymer (g) | 8% by mass PET polymer (h) | 6% by mass PET polymer (i) | 4.5% by mass PET polymer (j) | 1.8% by mass PET polymer (k) | 1% by mass PET polymer (l) | 0.5% by mass PET polymer (m) |
| PET polymer (a) | (Parts by mass) | 46 | 50 | 64 | 70 | 80 | 84 | 88 | 91 | 96.4 | 98 | 99 |
| PET polymer (b) | (Parts by mass) | 56 | 50 | 36 | 30 | 20 | 16 | 12 | 9 | 3.6 | 2 | 1 |

TABLE 2

| | | Layer A | | | Layer B | | | | Layer C | | | Layer D | | |
|---|---|---|---|---|---|---|---|---|---|---|---|---|---|---|
| | | Material type | TiO$_2$ concentration (% by mass) | Thickness (μm) | Material type | TiO$_2$ concentration (% by mass) | Thickness (μm) | Thickness proportion (%) | Formulation | Thickness (μm) | Transmittance (%) | Material type | TiO$_2$ concentration (% by mass) | Thickness (μm) |
| Example 1 | Back sheet BS1 | e | 18 | 50 | k | 1.8 | 200 | 79.4 | C3 | 2 | 19 | — | — | — |
| Example 2 | Back sheet BS2 | e | 18 | 25 | k | 1.8 | 100 | 78.7 | C3 | 2 | 19 | — | — | — |
| Example 3 | Back sheet BS3 | g | 10 | 50 | k | 1.8 | 200 | 79.4 | C3 | 2 | 19 | — | — | — |
| Example 4 | Back sheet BS4 | d | 25 | 50 | l | 1 | 200 | 79.4 | C3 | 2 | 19 | — | — | — |
| Example 5 | Back sheet BS5 | f | 15 | 50 | l | 1 | 200 | 79.4 | C3 | 2 | 19 | — | — | — |
| Example 6 | Back sheet BS6 | f | 15 | 50 | l | 1 | 200 | 79.8 | C5 | 0.5 | 41 | — | — | — |
| Example 7 | Back sheet BS7 | f | 15 | 35 | j | 4.5 | 170 | 70.7 | C5 | 0.5 | 41 | f | 15 | 35 |
| Example 8 | Back sheet BS8 | f | 15 | 15 | k | 1.8 | 95 | 75.7 | C5 | 0.5 | 41 | f | 15 | 15 |
| Example 9 | Back sheet BS9 | e | 18 | 50 | i | 6 | 200 | 79.4 | C3 | 2 | 19 | — | — | — |
| Example 10 | Back sheet BS10 | e | 18 | 50 | k | 1.8 | 200 | 79.4 | C8 | 2 | 18 | — | — | — |
| Comparative Example 1 | Back sheet BS11 | j | 4.5 | 50 | k | 1.8 | 200 | 79.4 | C3 | 2 | 19 | — | — | — |
| Comparative Example 2 | Back sheet BS12 | c | 28 | 50 | l | 1 | 200 | 79.4 | C3 | 2 | 19 | — | — | — |
| Comparative Example 3 | Back sheet BS13 | e | 18 | 25 | m | 0.5 | 100 | 78.7 | C3 | 2 | 19 | — | — | — |
| Comparative Example 4 | Back sheet BS14 | e | 18 | 100 | k | 1.8 | 150 | 59.5 | C3 | 2 | 19 | — | — | — |
| Comparative Example 5 | Back sheet BS15 | e | 18 | 50 | k | 1.8 | 200 | 79.1 | C6 | 2.9 | 87 | — | — | — |

TABLE 3

| | | Light Reflectance (%) | Cross-Cut Test | | Adhesive Strength to Sealant | | Heat Shrinkage | | Retention of Elongation at Break | | Change in Color Tone Before and After Weather Resistance Testing | | Heat-Curling Properties |
|---|---|---|---|---|---|---|---|---|---|---|---|---|---|
| | | | | | Initial | After Wet Heat Testing | Machine Direction | Transverse Direction | After Wet Heat Testing | After Weather Resistance Testing | | | |
| | | (%) | Layer A | Layer C | (N/10 mm) | (N/10 mm) | (%) | (%) | (%) | (%) | Layer A | Layer C | |
| Example 1 | Back sheet BS1 | 89 | 0 | 0 | ≥40 | ≥40 | 0.5 | 0 | A | A | 2 | 1 | A |

TABLE 3-continued

|  |  | Light Reflectance (%) | Adhesive Strength to Sealant | | | | Heat Shrinkage | | Retention of Elongation at Break | | Change in Color Tone Before and After Weather Resistance Testing | | Heat-Curling Properties |
|---|---|---|---|---|---|---|---|---|---|---|---|---|---|
|  |  |  | Cross-Cut Test | | Initial (N/10 mm) | After Wet Heat Testing (N/10 mm) | Machine Direction (%) | Transverse Direction (%) | After Wet Heat Testing (%) | After Weather Resistance Testing (%) | | | |
|  |  |  | Layer A | Layer C |  |  |  |  |  |  | Layer A | Layer C |  |
| Example 2 | Back sheet BS2 | 86 | 0 | 0 | ≥40 | ≥40 | 0.6 | 0.1 | A | A | 3 | 1 | A |
| Example 3 | Back sheet BS3 | 86 | 0 | 0 | ≥40 | ≥40 | 0.5 | -0.1 | A | A | 4 | 1 | A |
| Example 4 | Back sheet BS4 | 91 | 0 | 0 | ≥40 | ≥40 | 0.5 | 0 | A | A | 1 | 1 | A |
| Example 5 | Back sheet BS5 | 85 | 0 | 0 | ≥40 | ≥40 | 0.5 | 0 | A | A | 2 | 1 | A |
| Example 6 | Back sheet BS6 | 85 | 0 | 0 | ≥40 | ≥40 | 0.5 | 0 | A | A | 2 | 3 | A |
| Example 7 | Back sheet BS7 | 90 | 0 | 0 | ≥40 | ≥40 | 0.5 | 0 | A | A | 2 | 3 | A |
| Example 8 | Back sheet BS8 | 87 | 0 | 0 | ≥40 | ≥40 | 0.5 | -0.1 | A | A | 2 | 3 | A |
| Example 9 | Back sheet BS9 | 92 | 0 | 0 | ≥40 | ≥40 | 0.6 | 0.1 | C | A | 2 | 1 | A |
| Example 10 | Back sheet BS10 | 89 | 0 | 0 | ≥40 | 21 | 0.5 | 0.1 | A | A | 2 | 1 | A |
| Comparative Example 1 | Back sheet BS11 | 83 | 0 | 0 | ≥40 | ≥40 | 0.5 | 0 | A | C | 10 | 1 | A |
| Comparative Example 2 | Back sheet BS12 | 92 | 3 | 0 | ≥40 | ≥40 | 0.5 | 0 | B | A | 1 | 1 | A |
| Comparative Example 3 | Back sheet BS13 | 79 | 0 | 0 | ≥40 | ≥40 | 0.5 | -0.1 | A | A | 2 | 1 | A |
| Comparative Example 4 | Back sheet BS14 | 93 | 0 | 0 | ≥40 | ≥40 | 0.5 | -0.1 | C | A | 2 | 1 | A |
| Comparative Example 5 | Back sheet BS15 | 89 | 0 | 0 | ≥40 | 22 | 0.5 | 0 | A | A | 2 | 9 | A |
| Comparative Example 6 | Back sheet BS16 | 88 | 0 *[1] | 0 *[2] | ≥40 | ≥40 | 1.1 | 0.5 | D | A | 3 *[1] | 4 *[2] | C |

*[1] A 50-μm-thick white polyethylene terephthalate film, "LUMIRROR" (registered trademark) MX11, was evaluated due to the absence of Layer A.
*[2] A white EVA film (50 μm) was evaluated due to the absence of Layer C.

In "Material type" in Table 2, the PET polymers (c) to (m) used are respectively abbreviated as symbols c to m.

Example 1

As shown in Table 1, the PET polymer (e) was used as a layer-A-forming material, and the PET polymer (k) as a layer-B-forming material. These polymers were laminated through a laminator to have a configuration of layer B/layer A and molded into a sheet through a T-die. The lamination configuration, as shown in Table 2, was such that the thickness of the layer A was 50 μm, the thickness of the layer B was 200 μm, and the total thickness was 250 μm. The thickness was controlled by adjusting the discharge rate of the extruder. The molded sheet discharged through the T-die was cooled and solidified on a cooling drum with a surface temperature of 25° C. to give an unstretched sheet. The unstretched sheet was guided to rolls heated to 85° C. to 98° C., longitudinally stretched to 3.3 times in the machine direction, and cooled with rolls at 21° C. to 25° C. The longitudinally stretched film was then guided to a tenter with both ends of the film held by clips and transversely stretched to 3.6 times in the direction perpendicular to the machine direction in an atmosphere heated to 130° C. The stretched film was then heat set at 220° C. in the tenter, allowed to cool slowly and uniformly to room temperature, and taken up to obtain a substrate film with a thickness of 250 μm made of a biaxially stretched polyester film.

The layer-C-forming material C3 was then applied to the layer B surface of the substrate film using a wire bar and dried at 180° C. for 60 seconds to provide a layer C having a dried coating thickness of 2 μm. The sheet thus obtained was aged at 40° C. for 3 days to produce a back sheet for photovoltaic module BS1.

Examples 2 to 5

Back sheets for photovoltaic module BS2 to BS5 having the lamination configurations shown in Table 2 were produced in the same manner as described in Example 1 except that substrate films made of biaxially stretched polyester films were formed in the same manner as described in Example 1 using the PET polymer materials shown in Table 2 such that the layer A and the layer B each had a predetermined thickness.

Example 6

A substrate film made of a biaxially stretched polyester film was formed in the same manner as described in Example 1 using the PET polymer materials shown in Table 2 such that the layer A and the layer B each had a predetermined thickness.

The layer-C-forming material composition C5 was then applied to the layer B surface of the substrate film using a wire bar and dried at 180° C. for 60 seconds to provide a layer C having a dried coating thickness of 0.5 μm. The sheet thus obtained was aged at 40° C. for 3 days to produce a back sheet for photovoltaic module BS6 having the lamination configuration shown in Table 2.

Example 7

As shown in Table 1, the PET polymer (f) was used as a layer-A-forming material and a layer-D-forming material, and the PET polymer (j) as a layer-B-forming material. These polymers were laminated through a laminator to have a three-layer composite configuration of layer A/layer B/layer D and molded into a sheet through a T-die. The lamination configuration, as shown in Table 2, was such that the thicknesses of the layer A and layer D were 35 μm, the thickness of the layer B was 170 μm, and the total thickness was 240 μm. This configuration was achieved by adjusting the discharge rate of the extruder. The molded sheet discharged through the T-die was cooled and solidified on a cooling drum with a surface temperature of 25° C. to give an unstretched sheet. The unstretched sheet was guided to rolls heated to 85° C. to 98° C., longitudinally stretched to 3.3 times in the machine direction, and cooled with rolls at 21° C. to 25° C. The longitudinally stretched film was then guided to a tenter with both ends of the film held by clips and transversely stretched to 3.6 times in the direction perpendicular to the machine direction in an atmosphere heated to 130° C. The stretched film was then heat set at 220° C. in the tenter, allowed to cool slowly and uniformly to room temperature, and taken up to obtain a substrate film with a thickness of 250 μm made of a biaxially stretched polyester film.

The layer-C-forming material C5 was then applied to the layer D surface of the substrate film using a wire bar and dried at 180° C. for 60 seconds to provide a layer C having a dried coating thickness of 0.5 μm. The sheet thus obtained was aged at 40° C. for 3 days to produce a back sheet for photovoltaic module BS7 having the lamination configuration shown in Table 2.

Example 8

A substrate film made of a biaxially stretched polyester film having a three-layer composite configuration of layer A/layer B/layer D was formed in the same manner as described in Example 7 using the PET polymer materials shown in Table 2 such that the layer A, the layer B, and the layer D each had a predetermined thickness.

The layer-C-forming material C5 was then applied to the layer D surface of the substrate film 2 using a wire bar and dried at 180° C. for 60 seconds to provide a layer C having a dried coating thickness of 0.5 μm. The sheet thus obtained was aged at 40° C. for 3 days to produce a back sheet for photovoltaic module BS8 having the lamination configuration shown in Table 2.

Example 9

A back sheet for photovoltaic module BS9 having the lamination configuration shown in Table 2 was produced in the same manner as described in Example 1 except that the layer B was formed using the PET polymer (i) as shown in Table 2. The layer B of the film had a titanium oxide concentration of 6% by mass.

Example 10

A back sheet for photovoltaic module BS10 having the lamination configuration shown in Table 2 was produced in the same manner as described in Example 1 except that the layer-C-forming material C8 was used in place of the layer-C-forming material C3 to form a layer C having a dry thickness of 2.0 μm, as shown in Table 2.

Comparative Example 1

A substrate film made of a biaxially stretched polyester film was formed in the same manner as described in Example 1 using the PET polymer materials shown in Table 2 such that the layer A and the layer B each had a predetermined thickness. The layer A of the film had a titanium oxide concentration of 4.5% by mass.

The layer-C-forming material C3 was then applied to the layer B surface of the biaxially stretched polyester film using a wire bar and dried at 180° C. for 60 seconds to provide a layer C having a dried coating thickness of 2 μm. The sheet thus obtained was aged at 40° C. for 3 days to produce a back sheet for photovoltaic module BS11 having the lamination configuration shown in Table 2.

Comparative Example 2

A back sheet for photovoltaic module BS12 having the lamination configuration shown in Table 2 was produced in the same manner as described in Example 1 except that the layer A was formed using the PET polymer (c) as shown in Table 2. The layer A of the film had a titanium oxide concentration of 28% by mass.

Comparative Example 3

A back sheet for photovoltaic module BS13 having the lamination configuration shown in Table 2 was produced in the same manner as described in Example 1 except that the layer B was formed using the PET polymer (m) as shown in Table 2. The layer B of the film had a titanium oxide concentration of 0.5% by mass.

Comparative Example 4

A back sheet for photovoltaic module BS14 was produced in the same manner as described in Example 1 except that layers were laminated with the discharge rate of the extruder adjusted such that the thickness of the layer A was 100 µm, the thickness of the layer B was 150 µm, and the total thickness was 250 µm, as shown in Table 2.

Comparative Example 5

A back sheet for photovoltaic module BS15 having the lamination configuration shown in Table 2 was produced in the same manner as described in Example 1 except that the layer-C-forming material C6 was used in place of the layer-C-forming material C3 to form a layer C having a dry thickness of 2.9 µm, as shown in Table 2.

Comparative Example 6

A white EVA film (50 µm) containing titanium oxide particles, a transparent polyethylene terephthalate film ("LUMIRROR" (registered trademark) S10 available from Toray Industries, Inc., 210 µm), and a white polyethylene terephthalate film ("LUMIRROR" (registered trademark) MX11 available from Toray Industries, Inc., 50 µm), which contains a white pigment, were provided. Meanwhile, 16 parts of a dry laminating agent (DICDRY (registered trademark) LX-903 available from DIC Corporation), 2 parts of a curing agent (KL-75 available from DIC Corporation), and 29.5 parts of ethyl acetate were weighed out and stirred for 15 minutes to obtain a dry laminating adhesive with a solids concentration of 20%.

The dry laminating adhesive was then applied to one surface of the "LUMIRROR" (registered trademark) S10 and dried, and then the "LUMIRROR" (registered trademark) MX11 was dry laminated thereon. Subsequently, the dry laminating adhesive was applied again to the surface of the "LUMIRROR" (registered trademark) S10 opposite to the surface on which the "LUMIRROR" (registered trademark) MX11 was laminated. After the dry laminating adhesive was dried, the white EVA film was dry laminated thereon. The sheet thus obtained was aged at 40° C. for 3 days to obtain a back sheet for photovoltaic module BS16. As described above, the back sheet for photovoltaic module BS16 is composed of three films bonded together.

Discussion

Examples 1 to 8 and Example 10 represent the first construction. Due to having a layer A and a layer B having the characteristics of the first construction, the retention of elongation at break was high and the change in color tone was small after light resistance testing. Examples 1 to 9 represent the second construction. The back sheets of these examples are excellent in adhesive strength to encapsulant and durability of the adhesive strength to encapsulant.

INDUSTRIAL APPLICABILITY

The sealing sheet for photovoltaic module is excellent in adhesive strength to encapsulant, storage stability, productivity, and environmental resistance and suitable for use in photovoltaic modules. Thus, the sealing sheet for photovoltaic module and photovoltaic modules including the sealing sheet are useful.

The invention claimed is:

1. A back sheet for photovoltaic module comprising:
   a substrate film; and
   a layer C comprising hydroxyl groups, an acrylic resin having urethane linkage, blocked isocyanate compound, and a white pigment, disposed on one surface of the back sheet and being made of a layer-C-forming material composition (II),
   wherein the layer-C-forming material composition (II) comprises an acrylic resin having a hydroxyl group as a functional group reactive with an isocyanate group and two or more isocyanate compounds, the isocyanate compounds including 0.1 to 20 parts by mass of a blocked isocyanate compound having isocyanate groups protected by blocking groups based on 1 part by mass of an isocyanate compound having isocyanate groups not protected by blocking groups.

2. The back sheet according to claim 1, wherein the layer-C-forming material composition (II) further comprises the white pigment.

3. The back sheet according to claim 1, wherein the back sheet, when cut to a size of 20 cm×20 cm and heated at 150° C. for 30 minutes, exhibits a warpage of up to 30 mm at each of four corners of the sheet.

4. The back sheet according to claim 1, wherein the layer C has a light transmittance at 350 nm wavelength of 50% or less.

5. A photovoltaic module comprising: in sequence,
   a light-receiving-side protective substrate;
   a light-receiving-side encapsulant;
   cells;
   a backside encapsulant; and
   the back sheet according to claim 1,
   wherein the layer C of the back sheet faces the backside encapsulant.

6. A method of producing a photovoltaic module comprising:
   disposing, in sequence, a light-receiving-side protective substrate, a light-receiving-side encapsulant, cells, a backside encapsulant, and the back sheet according to claim 1 such that the layer C of the back sheet faces the backside encapsulant, thereby forming a layered product; and
   heating the layered product.

* * * * *